United States Patent [19]

Marrs

[11] Patent Number: 5,795,818

[45] Date of Patent: Aug. 18, 1998

[54] INTEGRATED CIRCUIT CHIP TO SUBSTRATE INTERCONNECTION AND METHOD

[75] Inventor: Robert C. Marrs, Scottdale, Ariz.

[73] Assignee: Amkor Technology, Inc., Chandler, Ariz.

[21] Appl. No.: 761,472

[22] Filed: Dec. 6, 1996

[51] Int. Cl.⁶ .................................................. H01L 21/44
[52] U.S. Cl. ................................................ 438/612; 438/613
[58] Field of Search ..................................... 438/612, 613, 438/614, 617

[56] References Cited

U.S. PATENT DOCUMENTS

| | | | |
|---|---|---|---|
| 3,373,481 | 3/1968 | Lins et al. | 29/471.3 |
| 3,429,040 | 2/1969 | Miller | 29/626 |
| 3,838,984 | 10/1974 | Crane et al. | 29/193.5 |
| 4,074,342 | 2/1978 | Honn et al. | 361/411 |
| 4,617,730 | 10/1986 | Geldermans et al. | 29/843 |
| 4,818,728 | 4/1989 | Rai et al. | 437/209 |
| 4,825,284 | 4/1989 | Soga et al. | 357/80 |
| 4,926,241 | 5/1990 | Carey | 357/75 |
| 4,967,313 | 10/1990 | Berner | 361/400 |
| 4,967,950 | 11/1990 | Legg et al. | 228/180.2 |
| 4,974,057 | 11/1990 | Tazima | 357/72 |
| 5,010,389 | 4/1991 | Gansauge et al. | 357/67 |
| 5,071,787 | 12/1991 | Mori et al. | 437/183 |
| 5,086,966 | 2/1992 | Melton et al. | 228/208 |
| 5,088,007 | 2/1992 | Missele | 361/386 |
| 5,105,259 | 4/1992 | McShane et al. | 357/72 |
| 5,111,279 | 5/1992 | Pasch et al. | 357/81 |

(List continued on next page.)

FOREIGN PATENT DOCUMENTS

| | | |
|---|---|---|
| 57-143838 | 9/1982 | Japan. |
| 58-97849 | 6/1983 | Japan. |
| 58-148434 | 9/1983 | Japan. |
| 58-157147 | 9/1983 | Japan. |
| 59-5639 | 1/1984 | Japan. |
| 59-31042 | 2/1984 | Japan. |
| 59-35439 | 2/1984 | Japan. |
| 59-40539 | 3/1984 | Japan. |
| 59-208751 | 11/1984 | Japan. |
| 60-89951 | 5/1985 | Japan. |
| 60-94744 | 5/1985 | Japan. |
| 62-67829 | 3/1987 | Japan. |
| 62-281435 | 12/1987 | Japan. |
| 63-164343 | 7/1988 | Japan. |
| 63-241955 | 10/1988 | Japan. |

(List continued on next page.)

OTHER PUBLICATIONS

Becher, et al., "Direct Chip Attach (DCA), The Introduction of New Packaging Concept for Portable Electronics", Motorola et al., Presented in the 1993 IEPS Proceedings pp. 519–533.

Chance, D., "Metallurgical System For C4 Joint BLM," IBM Technical Bulletin, vol. 27, No. 9, Feb. 1985, p. 5212.

Eldering, J. et al., "Flip Chip Attach of Silicon and GaAs Fine Pitch Devices As Well As Inner Lead Tab Attach Using Ball Bump Technology", Technical Univ. of Berlin, Presented in the 1993 IEPS Proceedings, pp. 304–320.

(List continued on next page.)

Primary Examiner—Kevin Picardat
Attorney, Agent, or Firm—Skjerven, Morill, MacPherson, Franklin & Friel LLP; Thomas S. MacDonald; Serge J. Hodgson

[57] ABSTRACT

An interconnection between bonding pads on an integrated circuit chip and corresponding bonding contacts on a substrate are formed. To form the interconnection, a metallization is formed on each of the substrate bonding contacts. Metal ball bond bumps are formed on selective ones of the bonding pads and then coined. The substrate and integrated circuit chip are heated. The coined ball bond bumps are then placed into contact with the corresponding metallizations, pressure and ultrasonic energy are applied, and a metal-to-metal bond is formed between each coined ball bond bump and the corresponding metallization.

17 Claims, 6 Drawing Sheets

U.S. PATENT DOCUMENTS

| | | | |
|---|---|---|---|
| 5,118,370 | 6/1992 | Ozawa | 156/73.1 |
| 5,147,084 | 9/1992 | Behun et al. | 228/56.3 |
| 5,198,963 | 3/1993 | Gupta et al. | 361/386 |
| 5,229,647 | 7/1993 | Gnadinger | 257/785 |
| 5,249,450 | 10/1993 | Wood et al. | 438/614 |
| 5,249,728 | 10/1993 | Lam | 438/614 |
| 5,272,111 | 12/1993 | Kosaki | 438/614 |
| 5,298,459 | 3/1994 | Arikawa et al. | 438/614 |
| 5,341,979 | 8/1994 | Gupta | 228/111 |
| 5,378,869 | 1/1995 | Marrs et al. | 219/121.71 |
| 5,451,274 | 9/1995 | Gupta | 148/512 |
| 5,478,007 | 12/1995 | Marrs | 438/126 |
| 5,483,100 | 1/1996 | Marrs et al. | 257/700 |
| 5,559,054 | 9/1996 | Adamjee | 438/617 |
| 5,587,336 | 12/1996 | Wang et al. | 438/614 |
| 5,633,204 | 5/1997 | Tago et al. | 438/617 |

FOREIGN PATENT DOCUMENTS

| | | |
|---|---|---|
| 63-275127 | 11/1988 | Japan . |
| 63-288031 | 11/1988 | Japan . |
| 63-316447 | 12/1988 | Japan . |
| 64-44049 | 2/1989 | Japan . |
| 1-140766 | 6/1989 | Japan . |
| 1-161850 | 6/1989 | Japan . |
| 1-191457 | 8/1989 | Japan . |
| 1-217935 | 8/1989 | Japan . |
| 1-217936 | 8/1989 | Japan . |
| 1-243533 | 9/1989 | Japan . |
| 2-132836 | 5/1990 | Japan . |
| 2-189926 | 7/1990 | Japan . |
| 2-246236 | 10/1990 | Japan . |
| 2-249248 | 10/1990 | Japan . |
| 2-150042 | 12/1990 | Japan . |

OTHER PUBLICATIONS

Harman, George G., "Wire Bonding in Microelectronics", National Institute of Standards and Technology, ©1989, 1991 International Society of Hybrid Microelectronics, ISBN 0–930815–25–4; Chapter 2, pp. 49–94.

Koopman, N. et al., "Chip–To–Package Interconnections," *Microelectronics Packaging Handbook*, 1989, Chapter 6, pp. 361–391.

"Encapsulated Solder Joint For Chip Mounting," IBM Technical Disclosure Bulletin, vol. 32, No. 10B, Mar. 1990, p. 480.

*"Flip Chip Technology, The Interconnect Method of the 90's, Technology Impact Report,"* Jun. 1992, prepared by International Interconnection Intelligence, Montara, CA 94037, 32 pages.

INTEGRATED CIRCUIT CHIP TO SUBSTRATE INTERCONNECTION AND METHOD

FIELD OF THE INVENTION

This invention relates to integrated circuits and, in particular, to the electrical interconnection of an integrated circuit chip to other components, circuits, or other electrically conductive materials. More particularly, the invention relates to the interconnection of an integrated circuit chip and a substrate or another integrated circuit in which electrically conductive traces, vias, and/or regions are formed.

BACKGROUND OF THE INVENTION

Current integrated circuit technology teaches three primary methods for making interconnections between an integrated circuit chip (a semiconductor die in which electronic circuitry is formed) and a substrate (a substrate routes electrical signals to and from the integrated circuit chip). These three methods of interconnection are wire-bonding, tape automated bonding (TAB), and Controlled Collapse Chip Connection (C4). Currently, wire-bonding interconnection is used in approximately 95% of packaged integrated circuits because wire-bonding is the least expensive of these methods and because commercially available programmable wire-bonding machines allow many different types of integrated circuit chips to be quickly and easily interconnected to a variety of package or substrate types.

However, wire-bonding has some disadvantages. For instance, with wire-bonding, bond wires are used to make the electrical connections between the chip bonding pads and the corresponding off-chip bonding contacts on a substrate. Unfortunately, bond wires, like any other electrical conductors, have inherent inductances and capacitances. In particular, the cylindrical shape and long length of the bond wires result in relatively high inductances and capacitances. These high inductances and capacitances can create noise or cross-talk, i.e., undesirable electromagnetic signals, on the intentional electrical signals traveling to and from the chip through the bond wires. Further, the generally long length of bond wires adds delay time to the propagation of electrical signals, slowing system performance.

Another disadvantage of wire-bonding is that the long bond wires typically extend in an arc from the bonding pads to the off-chip bonding contacts. As a result of this arcing, the minimum cross-sectional profile (or thickness) of a packaged integrated circuit using wire-bonding is relatively large compared to a packaged integrated circuit using the other, more expensive methods. Further, the bond wires must extend over the lateral distance between the chip bonding pads and the corresponding off-chip bonding contacts. As a result, wire-bonding requires a longer interconnect area and the distance between chips mounted on a substrate of, for instance, a multi-chip module, must be greater than desired and the chips cannot be packed as densely.

Another problem with wire-bonding is the sensitivity to unintentional displacement of fragile bond wires during handling, or as a result of the process of encapsulating the chip. This phenomena is known in the art as bond wire sweep. Bond wire sweep can result in undesirable electrical shorting or cross-talk between adjacent bond wires causing circuit operation problems or circuit failure.

TAB partially overcomes the mechanical problems associated with wire bonding by eliminating bond wires and making direct electrical connection between the bonding pads on the chip and the inner ends of a set of electrically conductive leads that are formed on an electrically insulative tape. Thus, with TAB, bond wire sweep and large package profile are no longer problems; however, since leads are still used, an unacceptable level of cross-talk, noise and signal delay problems persist. In addition, with TAB, chip density in multi-chip modules is still relatively large. Finally, TAB is an expensive interconnection method which requires special metallurgy on the integrated circuit wafer and which requires complex mounting equipment to connect the tab leads to the substrate. As a result, TAB is often not an economically viable option.

C4 interconnection overcomes much of the problems associated with wire-bonding, including most of the noise and cross-talk problems, by eliminating bond wires. With C4, a more direct electrical connection between the bonding pads on the chip and the off-chip bonding contacts is made using specially processed integrated circuit chips and solder bump connections. However, since the solder forms weak bumps, the solder bumps must be nested at the center of the integrated circuit chip to minimize stress. This requires the metallized interconnection layers of the integrated circuit chip to be fanned-in to the bonding pads nested in the center of the integrated circuit chip. Correspondingly, the substrate leads must be fanned-in to the substrate contacts nested in the center of the substrate. This fan-in of the metallized interconnection layers of the integrated circuit chip and the substrate leads disadvantageously adds inductance to the integrated circuit chip and substrate, respectively.

In a typical C4 interconnection, the aluminum bonding pads on an integrated circuit chip are coated and patterned with successive layers of chromium, copper and gold. Next, solder bumps or balls are formed on the coated bonding pads. Flux, and sometimes solder paste, is applied to the substrate. Then the chip solder bumps are placed in contact with the substrate bonding contacts and heated to reflow the solder. The resulting solder joint is then cooled to form an electrically conductive connection between the chip and substrate. After cooling, the flux is washed away and the chips are inspected for flux residue. The solder used with conventional C4 processes can be problematic because many fluxes are corrosive and residual flux must be carefully cleaned off and the product thoroughly inspected.

In C4, the chromium, copper and gold form a diffusion/adhesion layer which performs several functions. One function is to protect the aluminum bonding pads from the corrosive effects of fluxes. Another function is to ensure that reliable contact can be made and maintained between the solder and the aluminum bonding pads during life of product since lead and tin do not readily solder to aluminum.

Finally, testing C4 bumped chips requires special expertise and equipment. This is in part because the C4 bumps located on the bonding pads are nested at the center of the integrated circuit chip and inserting test probes into the small nested area is very difficult. Also, since the testing of the C4chips cannot be performed prior to the C4 bumping, chips processed for C4 interconnection must be processed and tested differently than chips processed for wire bonding interconnection and the equipment and expertise for C4 testing is not as widely available.

Nesting the substrate contacts to correspond with the nested C4 bumps also greatly complicates the substrate. In particular, to form the nested substrate contacts, substrates must be made with many more layers, very small vias, and fine patterning. This results in a very costly substrate material.

Thus, chips using C4 interconnection are processed more extensively using non-conventional technology, are more expensive, and are more sensitive to solder ball fatigue than chips using wire-bonding. Further, the substrates used with conventional C4 interconnections are more costly than substrates used with wire-bonding interconnections.

Another method of making an interconnection between an integrated circuit chip and substrate is presented in Gupta, U.S. Pat. No. 5,341,979 (hereinafter referred to as Gupta). Gupta teaches the formation of hourglass shaped gold bumps on bonding pads of an integrated circuit. The hourglass shaped gold bumps are matched with substrate contact pads and a bond is thermosonically formed between the hourglass shaped gold bumps and the contact pads.

Gupta teaches at column 7, lines 18 to 32, that, advantageously, the region of maximum stress of the hourglass shaped bumps is at the central or narrowest portion of the bump in contrast to conventional bumps where the region of maximum stress is at the interface of the bump and the semiconductor die or support substrate. However, Gupta teaches that to form the hourglass shaped bumps a relatively complex two layer photolithographic process must be used (see Gupta FIGS. 1 to 4 and related discussion). What is needed is a method and apparatus for making the interconnection between an integrated circuit chip and a substrate that has the key advantages of C4, i.e., improved electrical performance, small package profile, and increased reliability, but which, at the same time, is relatively simple and inexpensive to implement and which enables use of less complex lower cost substrate materials. Further, a reliable interconnection should be made without the use of complex photolithographic processes.

SUMMARY OF THE INVENTION

According to the invention, a method and apparatus is disclosed for forming a flip chip interconnection between an integrated circuit chip and a substrate. A direct metal-to-metal bond is made between ball bond bumps formed on bonding pads of an integrated circuit chip and metallizations which are formed on corresponding bonding contacts on a substrate. The method and apparatus of the invention overcomes the problems associated with wire bonding and the problems associated with connection of C4 bumps to substrates. At the same time, the method and apparatus of the present invention enables less expensive bumping methods and substrate materials to be utilized. For example, the substrate can be a printed circuit board (PCB), silicon, thin film, organic laminate, ceramic, alumina, flexible circuit or other material.

In one embodiment, an integrated circuit chip is interconnected with a substrate. The substrate has a first surface, the first surface including a bonding contact. On the bonding contact, a metallization is formed. The integrated circuit chip also has a first surface, the first surface including a bonding pad. On the bonding pad, electrically conductive material is formed. Between the electrically conductive material formed on the bonding pad and the metallization formed on the bonding contact, a metal-to-metal bond is formed.

In accordance with the invention, a method for forming an interconnection between an integrated circuit chip and a substrate is also presented. On first surfaces of the integrated circuit chip and substrate, bonding pads and bonding contacts, respectively, are formed. The method includes forming a metallization on each of the bonding contacts. Ball bond bumps are formed on selected ones of the bonding pads. The ball bond bumps are then coined to form coined ball bond bumps. The first surface of the integrated circuit chip is then placed adjacent the first surface of the substrate such that each of the coined ball bond bumps forms a metal-to-metal bond with a corresponding one of the metallizations.

The flip chip interconnection according to the invention eliminates the use of bond wires. Accordingly, the inductances and capacitances associated with bond wires are eliminated. This reduces the electrical noise and cross-talk in signals sent to and from the chip. In addition, the profile (i.e., thickness) of the packaged integrated circuit is reduced as compared to a wire-bonded packaged integrated circuit. Thus, with the method and apparatus of the invention, chips can be packed more densely in multi-chip modules since space that, in wire-bonded integrated circuits, would exist between the chip and the substrate bonding contacts is not needed. The method and apparatus of the invention also eliminates the possibility of bond wire sweep by eliminating the bond wires.

Further, the present invention avoids many of problems associated with conventional C4 interconnection. For instance, unlike conventional C4 interconnection, the method and apparatus of the invention uses chips with standard aluminum bonding pads that have been made using the less expensive wafer fabrication processes normally utilized for wire-bonding interconnection. Thus, the cost of producing interconnections with integrated circuit chips according to the invention is lower than the costs associated with conventional C4 applications. In addition, since, according to the invention, the same chips may be used for either wire bond or flip chip interconnection, the manufacturer does not have to maintain separate inventories of chips for wire-bonding and flip chip applications.

Finally, according to the invention, coined ball bond bumps formed on the chip are attached directly to a metallization formed on a bonding contact of the substrate. By this method, good electrical connections are formed without the use of flux, solder or complex photolithographic processes. This means savings in time, material, and equipment and fewer incidents of corrosion.

DETAILED DESCRIPTION OF THE PREFERRED EMBODIMENTS

Figure 1:
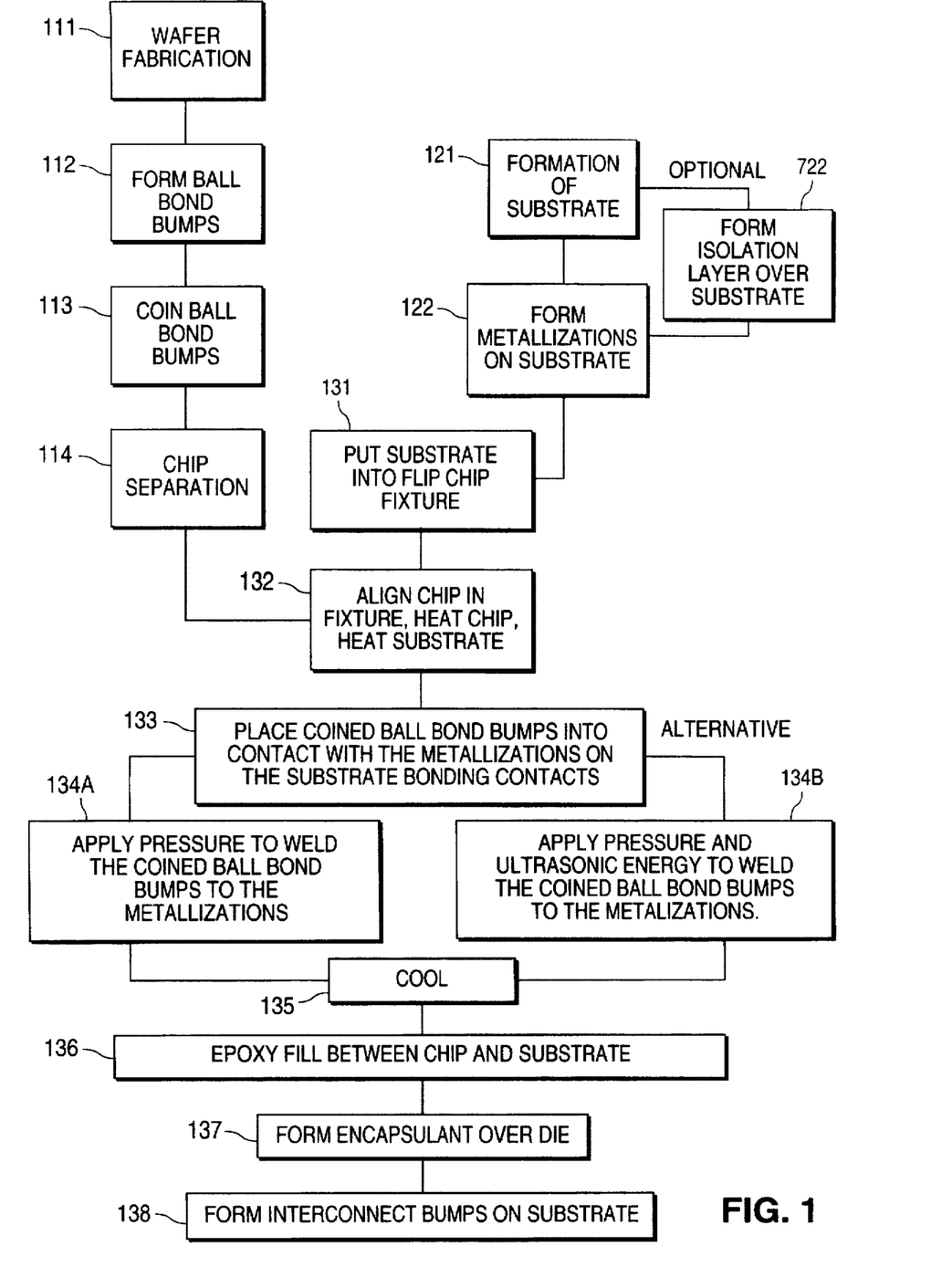
FIG. 1 is a process flow chart representing the significant steps taken to form an integrated circuit chip to substrate interconnection according to the invention.

FIG. 1 is a process flow chart representing the significant steps taken to form an integrated circuit chip to substrate interconnection according to the invention. The process of the invention entails preparing an integrated circuit chip (also referred to as a "chip") and a substrate separately, then attaching the integrated circuit chip to the substrate to form a partially packaged integrated circuit.

As shown by block 111, semiconductor chips are formed on a semiconductor wafer using conventional wafer fabrication techniques. The wafer may be of any conventional size desired and usually contains a plurality of chips. The internal structure of chips used for both conventional C4 applications and wire-bonding applications are typically the same. However, in the prior art, the locations of the bonding pads are different depending upon whether the chip will be used in a C4 or wire-bonding application. In particular, the bonding pads for a C4 application chip are nestled in the center of the chip whereas the bonding pads for a wire-bonding application chip are located along the periphery of the chip (are adjacent the edges of the chip). However, according to the invention, a flip chip integrated circuit chip to substrate interconnection can be formed using chips whose bonding pads have been patterned for use in conventional wire-bonding applications i.e. at the edges of the chip.

Figure 2:
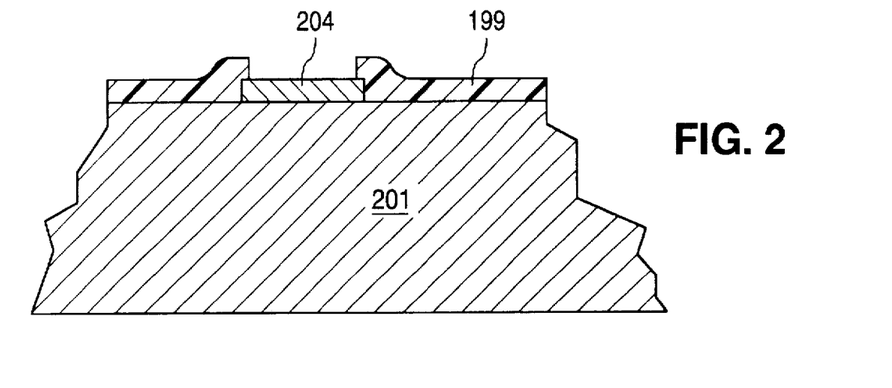
FIG. 2 is a cross-sectional view of a portion of an integrated circuit chip having a bonding pad.

According to the invention, a passivation or protection layer is added to the surface of the wafer by methods well known in the art. FIG. 2 is a cross-sectional view of a portion of an integrated circuit chip 201 (also referred to as chip 201) having a bonding pad 204 which is typically made of aluminum. As shown in FIG. 2, the passivation layer 199 is patterned to expose bonding pad 204.

Each integrated circuit chip on the wafer is then probe tested and bad chips, i.e., chips which are electrically or physically unsound, are marked or otherwise identified.

As described in detail below, after identification of bad chips, the good chips are "bumped" by forming a ball bond bump on predetermined bonding pads of each good chip. This process is represented by block 112 of FIG. 1. Forming ball bond bumps only on the good chips reduces the cost of producing packaged integrated circuits because time and expensive materials are not wasted on non-functioning chips.

Figure 3:
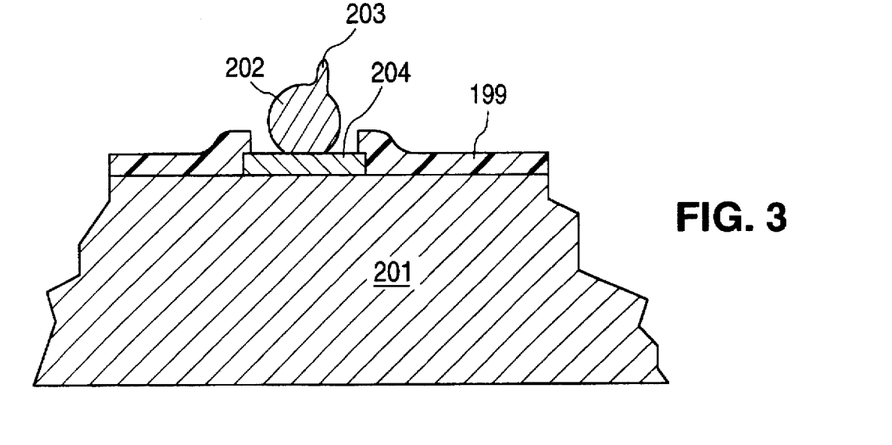
FIG. 3 is a cross-sectional view of a portion of an integrated circuit chip on which a ball bond bump is formed.

FIG. 3 is a cross-sectional view of the portion of the integrated circuit chip 201 on which a ball bond bump 202 is formed. Ball bond bump 202 is formed on bonding pad 204. It is to be understood that, on the entire chip 201, there are a plurality of ball bond bumps 202 formed over selected ones of the bonding pads 204 formed on chip 201. Ball bond bump 202 may be made of, for instance: gold or a gold alloy such as gold-palladium or gold-tin; copper, or a copper alloy such as copper-tin or copper-silver; indium; antimony; palladium or palladium alloy; or hybrids of epoxy and metal in wire form.

According to the invention, ball bond bumps 202 are formed using a conventional wire-bonding process and a conventional wire-bonder. For example, a Model 1484 wire-bonder from Kulike and Soffe of Horsham, Pa. is suitable for use with the invention.

To form ball bond bumps 202, the integrated circuit chip wafer (not shown) is mounted in a bonding machine (not shown). Bond material is then fed from a capillary (not shown). Ball bond bump 202 may be formed by thermocompression, i.e., a combination of force applied by the capillary and heat are used to form ball bond bump 202. Ball bond bump 202 may alternatively be formed thermosonically whereby ultrasonic energy is added to the combination of force from the capillary and heat to form ball bond bump 202. The bond material, usually gold, or gold alloy, then becomes welded to the aluminum and forms an intermetallic bond with the aluminum bonding pad 204. Accordingly, the method of the present invention does not require flux and there is no need for a diffusion/adhesion layer.

After attachment of ball bond bump 202 to the bonding pad 204, the wire from the capillary is clamped and pulled to break the wire above ball bond bump 202. This pulling and breaking of the wire leaves a small tail 203 at the top of each ball bond bump 202.

As represented by block 113 of FIG. 1, and described in detail below, after the formation of ball bond bumps 202, ball bond bumps 202 are coined to eliminate the irregularities and tails 203 of ball bond bumps 202. The same equipment used in the formation of ball bond bumps 202 may be used to form coined ball bond bumps except that a coining tool is substituted for the capillary.

Figure 4A:
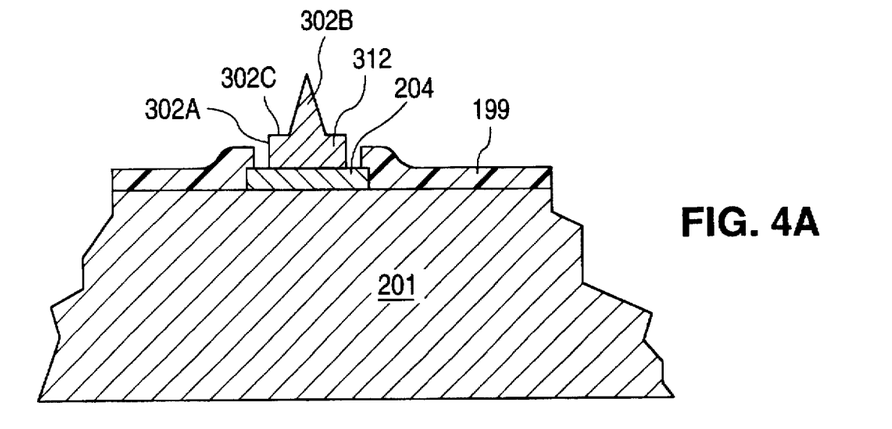
FIGS. 4A, 4B and 4C are cross-sectional views of a portion of an integrated circuit chip on which a coined ball bond bump is formed for use with alternative embodiments of the invention.
Figure 4B:
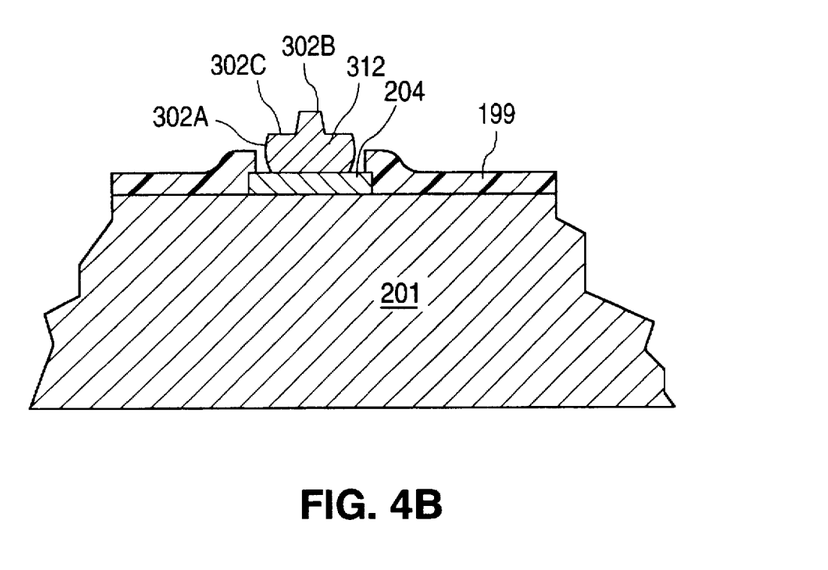
Figure 4C:
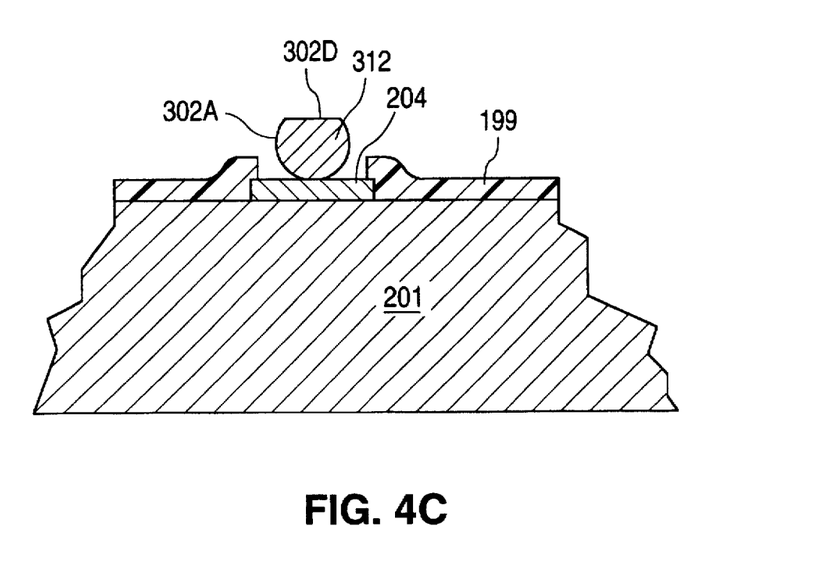

FIGS. 4A, 4B, and 4C are cross-sectional views of coined ball bond bumps 312 according to alternative embodiments of the invention. In the embodiments of FIGS. 4A and 4B, the coining operation deforms ball bond bump 202 such that coined ball bond bump 312 has a base section 302A and a generally protruding section 302B. A seating plane 302C is formed on base section 302A and adjoins the base of protruding section 302B which is approximately centrally formed on seating plane 302C.

The coined ball bond bump 312 of FIG. 4A has a substantially cone shaped protruding section 302B and is formed by a coining tool having a conical cross-section, such as described below with respect to FIG. 5A. In FIG. 4B, protruding section 302B of coined ball bond bump 312 has a truncated conical shape as would be formed by a coining tool such as described below with respect to FIG. 5B.

Figure 5A:
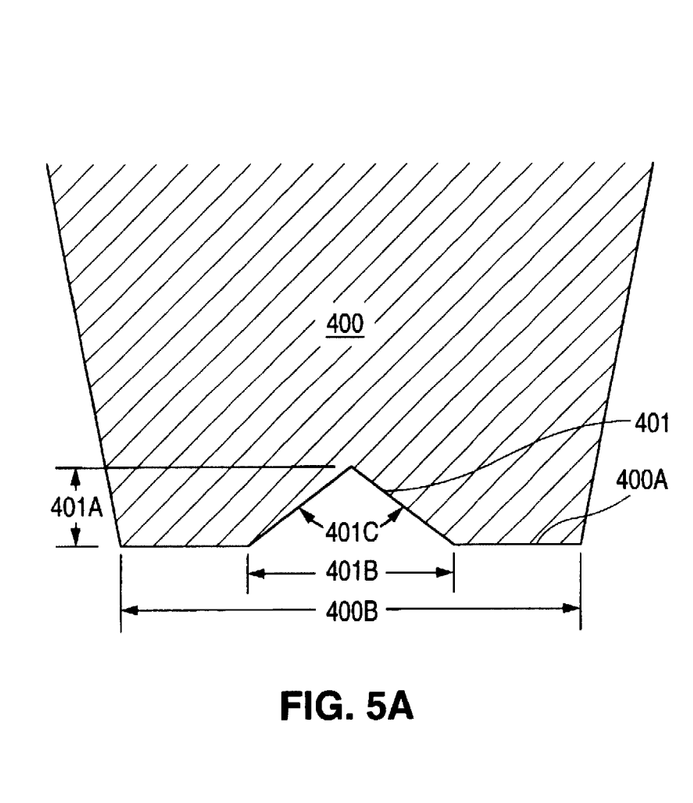
FIGS. 5A and 5B are cross-sectional views of coining tools for use with alternative embodiments of the invention.
Figure 5B:
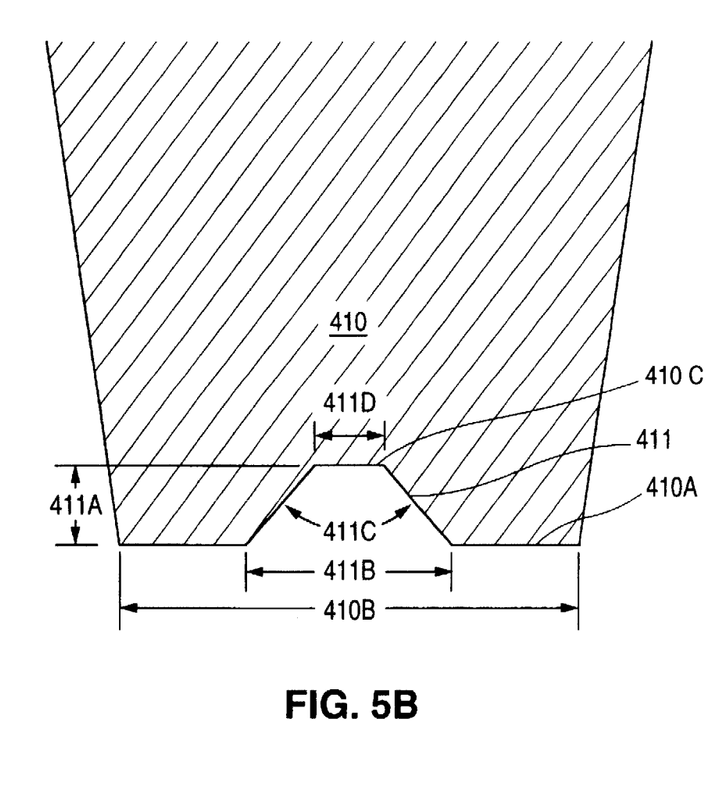

FIGS. 5A and 5B are cross-sectional views of coining tools 400 and 410 for use with alternative embodiments (FIGS. 4A and 4B) of the invention. Coining tools 400 and 410 each have an indentation 401 or 411, respectively, that contacts ball bond bump 202 during the coining process.

Indentation 401 of FIG. 5A has a generally conical shape. An interior angle 401C of indentation 401 measures, in one embodiment, between 60°–120° and, in another embodiment, approximately 110°. The width 401B of indentation 401 at base surface 400A of coining tool 400 is, in one embodiment, approximately 0.002 inch (51 microns). The height 401A of indentation 401 from base surface 400A to the vertex of indentation interior angle 401C is, in one embodiment, approximately 0.0007 inch (18 microns). It is to be understood that other heights 401A and widths 401B can be used.

The indentation 411 of coining tool 410 (FIG. 5B) has a truncated conical shape, i.e., a generally conical shape with a flat top. An interior angle 411C of indentation 411 measures, in one embodiment, between 60°–120° and, in another embodiment, approximately 110°. The width 411B of indentation 411 at base surface 410A of coining tool 410, and the height 411A of indentation 411 from base surface 410A to the flat surface 410C of indentation 411 are governed by the same considerations as width 401B and height 401A of coining tool 400. In one embodiment, width 411B is approximately 0.002 inch (51 microns) and height 411A is approximately 0.0007 inch (18 microns). Width 411D at the truncated end of indentation 411 must be smaller than width 411B. In one embodiment, width 411D is between 0.0002–0.001 inch (5–25 microns) and, in another embodiment, width 411D is approximately 0.0005 inch (13 microns).

Coining tools having indentations with other shapes can also be used. For example, the cross-section of the indentation can have a curved shape such as a circular, elliptical or parabolic arc.

Both coining tools 400 and 410 have a circular cross-section as viewed in a direction parallel to the plane of FIGS. 5A and 5B, and perpendicular to base surfaces 400A and 410A, respectively. However, it is to be understood that the shape of this cross-section is not critical to the invention and other rounded cross-sections, such as an oval, can be used. The diameters 400B and 410B of base surfaces 400A and 410A, respectively, are, in one embodiment, 0.005 inch (177 microns). Diameters 400B and 410B can be any size that is small enough to avoid interference between coining tool 400 or 410 and ball bond bumps 202 adjacent the ball bond bump 202 being coined. Diameters 400B and 410B must also be larger than widths 401B and 411B of indentations 401 and 411, respectively.

The use of a coining tool with an indentation, such as shown in FIGS. 5A and 5B, allows for the formation of coined ball bond bumps 312 having a uniform height (Z-axis) and a precisely located center (X-axis and Y-axis) in the plane parallel to the surface of chip 201. Control of the geometry of coined ball bond bump 312 (FIGS. 4A and 4B) is particularly advantageous and important in view of the irregular size and shape of ball bond bumps 202 obtained using conventional wire-bonding equipment. The height of protruding section 302B of coined ball bond bump 312 from the surface of chip 201 can be controlled within a tolerance of less than 0.0002 inch (5 microns). The center of protruding section 302B of each coined ball bond bump 312 can be located within a tolerance of 0.00008 inch (2 microns) with respect to the center of the bond pad, even if the center of un-coined ball bond bump 202 is off-center by as much as 0.001 inch (25 microns). By controlling the geometry of coined ball bond bumps 312, chips 201 can be bumped which have very fine pad to pad pitches (i.e. distances between pads of 0.004–0.005 inches). In contrast chips bumped by conventional C4 processes have pad to pad pitches which usually range from 0.008 to 0.010 inches. Controlling the geometry of the coined ball bond bumps 312 is also particularly important because fabrication tolerances must enable matching of coined ball bond bumps 312 on chip 201 to equally fine pitched patterns formed on the substrate (not shown). In the prior art, maintaining this high precision has often driven the cost of the packaged integrated circuit so high that it was not economically feasible to produce.

FIG. 4C is a cross-sectional view of a coined ball bond bump 312 according to a third embodiment of the invention. In FIG. 4C, coined ball bond bump 312 has a base section 302A and flat top surface 302D. The embodiment of FIG. 4C is particularly well suited for low cost applications because the ball bond bumps can be coined all at once by application of a flat surface to all ball bond bumps 202 on chip 201 simultaneously, instead of applying a coining tool to each ball bond bump 202 individually as is done to form the coined ball bond bumps 312 of FIGS. 4A and 4B.

On the other hand, for fine pitch structures, the individually coined ball bond bumps 312 of FIGS. 4A and 4B are preferred due to the pointed shape of the resulting coined ball bond bumps 312.

As represented by block 114 of FIG. 1, integrated circuit chips 201 with coined ball bond bumps 312 are separated by using a conventional sawing process. (In an alternative embodiment, the wafer is first sawn into separate chips 201. The good chips, i.e., electrically and physically sound chips, are then separated from the bad chips. Ball bond bumps 202 are then formed on each of the good chips 201 and each of ball bond bumps 202 are coined, as described above, to create coined ball bond bumps 312.)

As described in detail below, each of the chips 201 are then attached to a substrate by contacting coined ball bond bumps 312 to corresponding metallizations on the substrate bonding contacts.

As represented by block 121 of FIG. 1, a substrate is formed for use with the integrated circuit chip to substrate interconnection according to the invention. The substrate is made of any one of various materials such as organic laminate, ceramic, alumina, silicon, printed circuit board, thin film or flexible circuit. In one embodiment, the substrate is created by a printed circuit board process. The substrate can include one or more layers fabricated and interconnected by methods well known by those skilled in the art.

Figure 6:
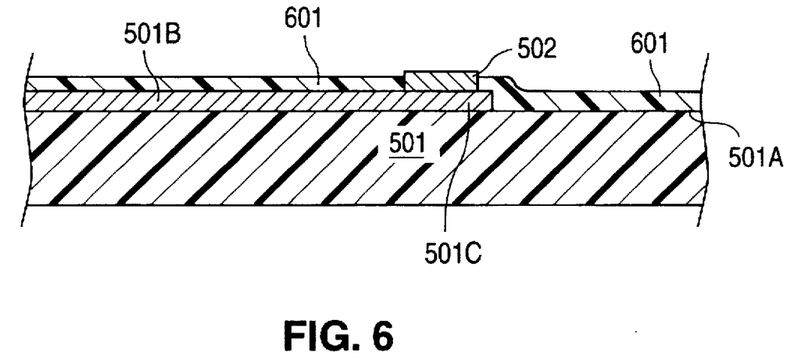
FIG. 6 is a cross-sectional view of a portion of a substrate showing an upper surface, a conductive trace, a substrate bonding contact, and a metallization in accordance with one embodiment of the invention.

FIG. 6 is a cross-sectional view of substrate 501 showing upper surface 501A, conductive trace 501B, substrate bonding contact 501C, and metallization 502 in accordance with the present invention.

Conductive trace 501B and substrate bonding contact 501C on upper surface 501A of substrate 501 are typically aluminum and are electrically connected to one another. In one embodiment, conductive trace 501B and substrate bonding contact 501C are formed integrally, for example, are formed from the same layer of conductive material. Conductive trace 501B and substrate bonding contact 501C are created by methods well known in the art. It is to be understood that, on the entire substrate 501, there are a plurality of conductive traces 501B and substrate bonding contacts 501C formed on upper surface 501A.

As represented by block 722 of FIG. 1, optionally, an isolation layer 601 (FIG. 6) can be formed over substrate 501 and conductive trace 501B. As shown in FIG. 6, isolation layer 601 is patterned such that isolation layer 601 leaves uncovered a portion of substrate bonding contact 501C. Isolation layer 601 ensures that metallization 502 is applied only to substrate bonding contacts 501C. Isolation layer 601 is particularly useful when the manufacturer wants to conserve the amount of material used in forming metallization 502, such as when metallization 502 includes gold or a gold alloy.

Isolation layer 601 is a dielectric material, for example, a plating mask or a solder mask. Isolation layer 601 is applied using methods well known in the art such as dry film and etching processes, liquid film and photo-imaging processes, IBM's "SLC" process, or other known fabrication techniques.

Figure 7:
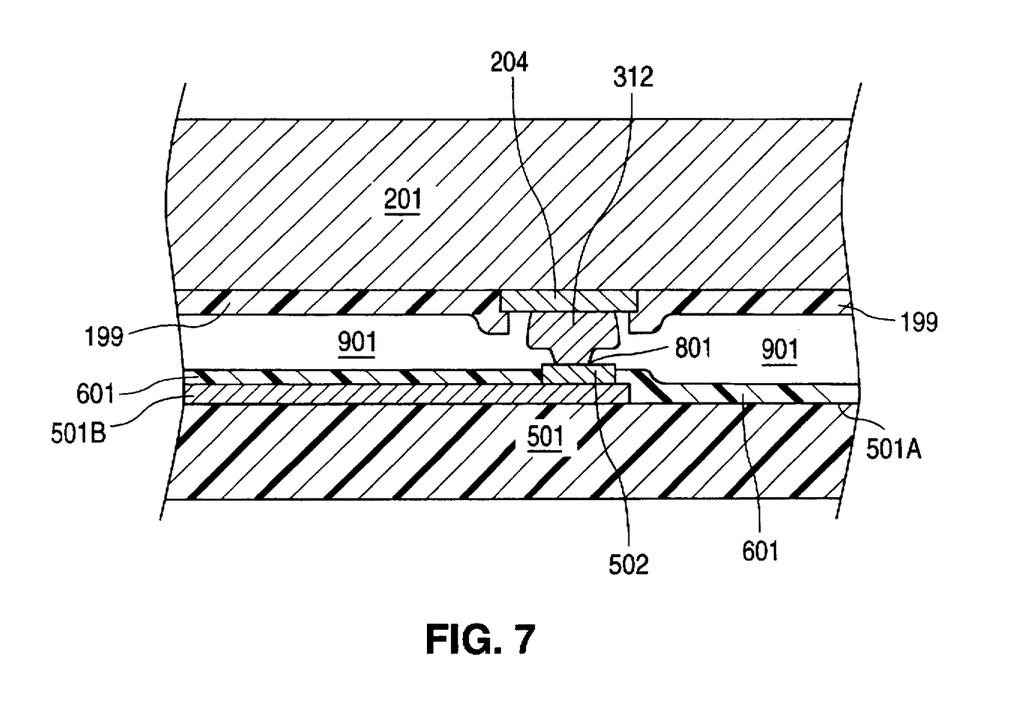
FIG. 7 is a cross-sectional view of a portion of the integrated circuit chip, disposed adjacent the substrate upper surface including the coined ball bond bump which is welded onto the metallization on the substrate bonding contact to form a metal-to-metal bond in accordance with one embodiment of the invention.
Figure 8:
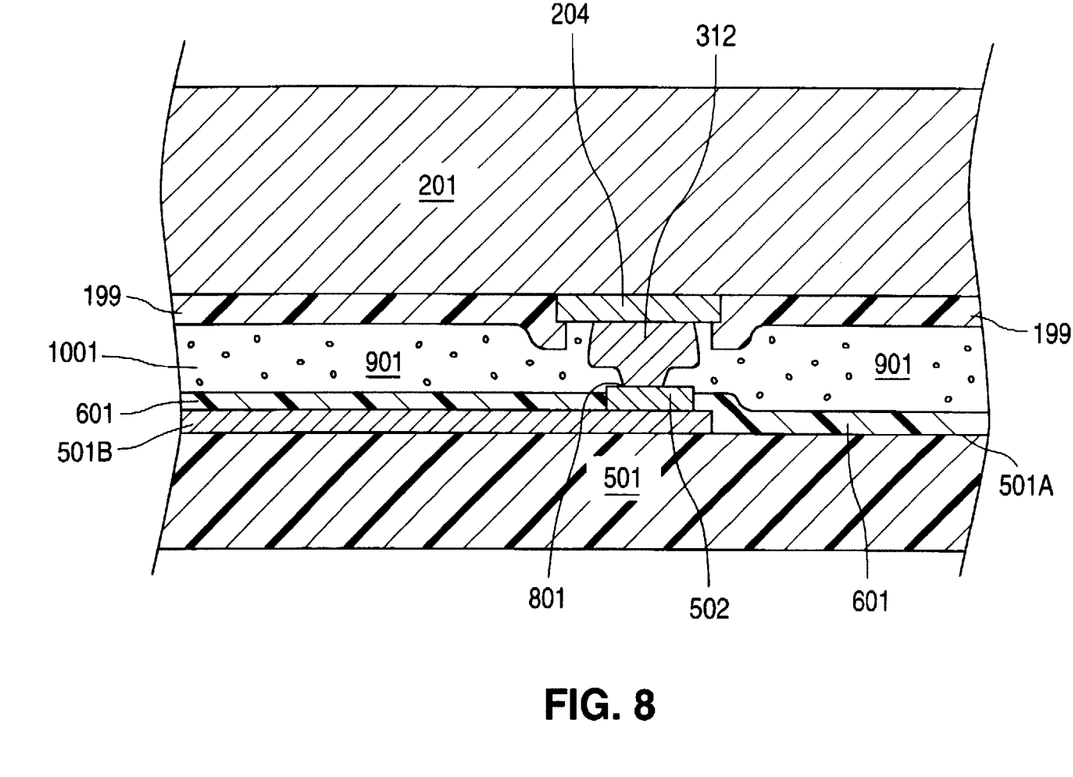
FIG. 8 is a cross-sectional view of the integrated circuit chip attached to the substrate with epoxy filling the region between the substrate and the integrated circuit chip in accordance with an alternative embodiment of the invention.

Although isolation layer 601 is illustrated in FIGS. 6, 7 and 8, it is understood that step 722 in FIG. 1 is optional and that isolation layer 601 does not have to be formed.

As represented by block 122 of FIG. 1, the metallization 502 (FIG. 6) is formed on substrate bonding contact 501C. Metallization 502 can be a multi-metal-layer metallization. In one embodiment, metallization 502 is formed by applying a copper layer over predetermined portions of substrate bonding contact 501C. Then a nickel layer is selectively applied over the copper layer. Finally a layer of gold or gold alloy is applied over the nickel layer. Generally, the thicknesses of the copper, nickel and gold layers are within the range of 200 micrometers (μm) to 2000 μm, 100 μm to 300 μm and 10 μm to 30 μm, respectively.

In alternative embodiments, metallization 502 is made of, for instance: aluminum; tin over gold over nickel over copper; tin over nickel over copper; lead over gold over tin over aluminum; or tin over lead over gold over tin over aluminum. Metallization 502 is applied using conventional processes such as electroplating or electro-less plating.

As represented in block 131 of FIG. 1, the substrate is next placed into a standard flip chip fixture such as the Flip Chip Aligner/Bonder available from Research Devices in West Piscataway, N.J. as Part No. M8B. The flip chip fixture includes a heater that can be used, as explained below, to heat the substrate during attachment of the chip.

As represented by block 132 of FIG. 1, the chip is held in place above the substrate by the flip chip fixture so that the coined ball bond bumps are aligned above corresponding substrate bonding contacts. The substrate is then heated. The chip is aligned with the substrate using a vision system, as is well known in the art. The chip is picked up with a conventional vacuum tool (not shown). The vacuum tool holding the chip can also include an optional heater which heats the chip.

As represented by block 133 of FIG. 1, the coined ball bond bumps are then placed into contact with the corresponding metallizations on the substrate bonding contacts.

As represented in block 134A of FIG. 1, pressure is applied to the chip and substrate which forces the chip and substrate towards one another. The combination of heat and pressure causes a weld to form between the coined ball bond bumps and the corresponding metallizations.

In one embodiment, the substrate and chip are heated (see block 132 of FIG. 1) to 190° centigrade (C) and 240° C., respectively. A pressure (see block 134A of FIG. 1) of about 20 grams per coined ball bond bump is applied for 10 milliseconds (msec, where 1 msec =¹⁄₁₀₀₀ second).

In another embodiment, the substrate and chip are heated (see block 132 of FIG. 1) to 160° C. and 180° C., respectively. A pressure (see block 134A of FIG. 1) of about 10 grams per coined ball bond bump is applied for 10 msec.

As represented by block 134B of FIG. 1, low level ultrasonic energy can also be applied through the vacuum tool (not shown) to vibrate the chip while the pressure is applied to the chip and substrate. This ultrasonic energy produces vibration which is transmitted from the chip through the coined ball bond bumps to the corresponding metallizations and causes a weld to form between the coined ball bond bumps and the corresponding metallizations. The vibration also causes oxide layers that may be present on the surfaces of the metallizations to break up. The ultrasonic energy and heat applied to the chip will also work to clean surface contamination from the coined ball bond bumps. Consequently, a better bond is formed between the metallizations and the coined ball bond bumps without the use of conventional fluxes. This is a highly advantageous feature because conventional fluxes are difficult to clean after soldering and can corrode the aluminum bonding pads.

Instead of, or in addition to, the use of ultrasonic energy to break up surface oxides on the metallizations, hydrogen gas or a hydrogen-nitrogen gas mixture can be made to flow over the substrate, metallizations, and chip, while the coined ball bond bumps on the chip are bonded to the metallizations. This further reduces formation of surface oxides. Additionally, the metallizations can be pre-cleaned with a plasma gas to further promote effective welding.

In one embodiment of the invention, both coined ball bond bump 312 (FIGS. 4A, 4B and 4C) and metallization 502 are made of gold. In this embodiment, when heat, ultrasonic energy, and pressure are applied to chip 201 and substrate 501, protruding sections 302B of coined ball bond bumps 312 (FIGS. 4A and 4B) melt and collapse into the gold of metallizations 502 to form a welded bond.

FIG. 7 is a cross-sectional view of a portion of chip 201 disposed adjacent substrate upper surface 501A including metallization 502 and coined ball bond bump 312 which is welded onto metallization 502 on substrate bonding contact 501C to form a metal-to-metal bond 801. As shown in FIG. 7, a region 901 exists between substrate 501 and chip 201.

In one embodiment of the invention, the resulting bond 801 is a direct gold to gold connection between coined ball bond bump 312 on chip 201 and metallization 502 on substrate bonding contact 501C on substrate 501. Bond 801 is particularly advantageous because bond 801 is made without the use of additional solder or epoxy.

Several advantages result from the gold-to-gold or metal-to-metal bond 801 described above. First, gold is very ductile and malleable so it does not harden and crack. Also, the resulting weld is not as susceptible to melting as solder, which reflows at a relatively low temperature. This is a significant advantage over my U.S. Pat. No. 5,478,007 in which solder forms part of the electrical interconnection between the chip and substrate. Further, as described above, there is no need for applying solder flux and therefore no added risk of corrosion of the aluminum bonding pads 204 and no need to clean off residual flux or inspect for residual flux.

Additionally, with the present invention, no epoxies are required. This is a significant advantage because epoxies are difficult to apply in a consistent pattern with fine pitch applications. Further, epoxies generally contain silver to enable conduction and this silver can electro-migrate. Epoxies can also result in high contact resistance which degrades circuit performance. Thus, not using epoxies in the present invention provides another significant advantage over my U.S. Pat. No. 5,478,007 in which electrically conductive epoxy forms part of the electrical interconnection between the chip and substrate.

As represented by block 135 of FIG. 1, after coined ball bond bump 312 has been bonded to metallization 502, bond 801 is allowed to cool.

As represented by block 136 of FIG. 1, after attaching chip 201 to substrate 501, open region 901 between chip 201 and metallization 502 is filled with an epoxy. FIG. 8 is a cross-sectional view of chip 201 attached to substrate 501 with an epoxy 1001 filling the region 901 between substrate 501 and chip 201. As shown in FIG. 8, epoxy 1001 encloses and protects coined ball bond bump 312 from the ambient environment.

The presence of epoxy 1001 eliminates air pockets under chip 201 where moisture and contaminants can collect. Importantly, epoxy 1001 also helps relieve stress on bonds 801 between coined ball bond bumps 312 and metallizations 502.

As represented by block 137 of FIG. 1, in one embodiment of the invention, an encapsulant is used to enclose chip 201. The encapsulant encloses chip 201 so as to protect chip 201 from the ambient environment. The encapsulant is formed of, for instance, plastic using methods well known in the art such as injection molding, transfer molding, or potting. Use of an encapsulant to enclose chip 201 is not critical to the invention, and, in other embodiments of the invention, chip 201 may be encapsulated by other methods known to those of skill in the art.

As represented by block 138 of FIG. 1, interconnect bumps or solder balls can be formed on a lower surface of the substrate which is opposite the upper surface (501A) of the substrate. The interconnect bumps or solder balls are formed on interconnection pads on the lower surface of the substrate. The interconnection pads may be at the end of a via formed through the substrate or at the end of a trace formed on the substrate lower surface. The solder balls may be created by methods well known in the art.

The solder balls are used to make the electrical connection between the integrated circuit chip, the substrate, and the electrically conductive material formed on other, higher level components such as a printed circuit board. The substrate is placed onto the electrically conductive material of the higher level component such that the solder balls contact bonding locations on the higher level component. The solder balls are then heated to reflow the solder and cooled to solidify and form a bond between the substrate and the electrically conductive material on the higher level component.

It is to be understood that the method of electrically connecting the substrate to the electrically conductive material on, for instance, a printed circuit board is not part of the integrated circuit chip to substrate interconnection according to the invention and is not critical to the invention. Therefore, other methods for making this electrical connection can be employed.

The method and apparatus of the invention has all the advantages of conventional flip chip (C4) interconnection. For instance, since bonding pads 204 on chip 201 are connected directly to corresponding metallizations 502 on substrate bonding contacts 501C on substrate 501 (see FIG. 8), electrical noise in signals sent to and from chip 201 is significantly reduced and the profile of a packaged integrated circuit using the integrated circuit chip to substrate interconnection of the invention can be smaller. In addition, chips 201 interconnected with substrate 501, according to the method and apparatus of the invention, can be more densely packed in multi-chip modules (not shown). Further, by eliminating bond wires, there is no possibility of bond wire sweep.

In addition to having all the advantages of C4 interconnection, the method and apparatus of the invention is considerably less expensive than conventional C4 methods because the invention uses integrated circuit chips 201 made for wire-bond interconnection, and chips used for wire-bonding applications typically cost less to make than chips processed for conventional C4 applications. Further, according to the invention, there is no need for a manufacturer to maintain separate inventories of chips for wire-bonding and flip chip applications.

Production costs are further reduced with the method and apparatus of invention, because conventional wire-bonding equipment can be used which is considerably less expensive than the equipment used to bump chips for a conventional C4 process. In addition, the predominance of wire-bonding in the integrated circuit industry means that existing wire-bonding equipment can be used to implement the invention. Further, the amount of time necessary to bump chips using conventional wire-bonding equipment is less than the time required for bumping chips utilizing the C4 process; therefore, the chips can be processed more quickly and inexpensively.

Finally, direct metal-to-metal bonds 801 between coined ball bond bumps 312 and corresponding metallizations 502, which are made in accordance with the invention (see FIGS. 7 and 8), eliminate the need to apply and/or cure additional solder or epoxy and eliminate the need to use complex photolithographic processes. This saves time, equipment and materials and avoids the corrosion and manufacturing problems associated with solders and epoxies.

Various embodiments of the invention have been described. These descriptions are intended to be illustrative, not limitative. It will be apparent to one skilled in the art that certain modifications may be made to the invention without departing from the scope and spirit of the appended claims.

I claim:

1. A method for forming an interconnection between an integrated circuit chip and a substrate, said method comprising the steps of:

providing an integrated circuit chip having a first surface with bonding pads formed thereon and a substrate having a first surface with bonding contacts formed thereon, said bonding contacts comprising an electrically conductive material;

forming a metallization on selected ones of said bonding contacts;

forming a ball bond bump on selected ones of said bonding pads;

coining each of said ball bond bumps to form coined ball bond bumps; and placing said first surface of said integrated circuit chip adjacent said first surface of said substrate such that each of said coined ball bond bumps forms a metal-to-metal bond with a corresponding one of said metallizations.

2. A method as in claim 1, wherein said step of coining is performed with a coining tool.

3. A method as in claim 2, wherein said coining tool has an indentation formed in a base surface, said indentation having a generally conical cross-sectional shape.

4. A method as in claim 2, wherein said coining tool has an indentation formed in a base surface, said indentation having a truncated conical shape.

5. A method as in claim 2, wherein said coining tool has an indentation formed in a base surface to form said coined ball bond bumps, said coined ball bond bumps having a cross-sectional shape such that a width of said cross-section at a first distance above said first surface of said integrated circuit chip is less than a width of said cross-section at a second distance above said first surface of said integrated circuit chip, said first distance being greater than said second distance.

6. A method as in claim 1 comprising the additional step of:

forming an isolation layer over said first surface of said substrate except over portions of said bonding contacts.

7. The method as in claim 1 wherein said ball bond bumps are formed from the group consisting of gold and a gold alloy.

8. The method as in claim 1 wherein each of said metallizations include an outermost layer which is formed from the group consisting of gold and a gold alloy.

9. The method as in claim 1 wherein said metallizations are multi-metal-layer metallizations.

10. The method as in claim 9 wherein said step of forming said metallizations comprises plating a gold layer over a nickel layer over a copper layer.

11. The method as in claim 1 further comprising the step of heating said integrated circuit chip and said substrate wherein said placing step and said heating step causes each of said coined ball bond bumps to be in electrical and physical contact with said corresponding one of said metallizations.

12. The method as in claim 1 wherein said step of placing further comprises the step of applying pressure to said integrated circuit chip and said substrate, wherein said pressure forces said integrated circuit chip towards said substrate.

13. The method as in 12 wherein said step of placing further comprises the step of applying ultrasonic energy to vibrate said integrated circuit chip.

14. The method as in claim 1, wherein said ball bond bumps are formed by a wire bonder.

15. The method as in claim 1, wherein said bonding contacts comprise aluminum.

16. A method of forming a packaged electronic device comprising the steps of:

provinding a wafer comprising an integrated circuit chip, said integrated circuit chip having a first surface with a bonding pad formed thereon;

forming a ball bond bump on said bonding pad;

coining said ball bond bump to form a coined ball bond bump;

sawing said wafer to separate said integrated circuit chip;

providing a substrate having a first surface and a bonding contact on said substrate first surface, said bonding contact comprising an electrically conductive material;

forming a metallization on said bonding contact, said metallization comprising at least one metal containing layer;

heating said integrated circuit chip and said substrate;

placing said coined ball bond bump into contact with said metallization; and applying pressure to weld said coined ball bond bump to said metallization.

17. The method of claim 16 wherein said step of sawing said wafer precedes said step of forming a ball bond bump.

* * * * *